(12) United States Patent
Chung et al.

(10) Patent No.: US 11,464,117 B2
(45) Date of Patent: Oct. 4, 2022

(54) PRINTED CIRCUIT BOARD AND MANUFACTURING METHOD THEREFOR

(71) Applicant: LG INNOTEK CO., LTD., Seoul (KR)

(72) Inventors: Hee Young Chung, Seoul (KR); Jae Man Park, Seoul (KR); Moo Seong Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 280 days.

(21) Appl. No.: 16/651,143

(22) PCT Filed: Sep. 18, 2018

(86) PCT No.: PCT/KR2018/010973
§ 371 (c)(1),
(2) Date: Mar. 26, 2020

(87) PCT Pub. No.: WO2019/066351
PCT Pub. Date: Apr. 4, 2019

(65) Prior Publication Data
US 2020/0236789 A1    Jul. 23, 2020

(30) Foreign Application Priority Data
Sep. 29, 2017  (KR) .......... 10-2017-0128152

(51) Int. Cl.
*H05K 1/02* (2006.01)
*H05K 3/06* (2006.01)
(Continued)

(52) U.S. Cl.
CPC .......... *H05K 3/067* (2013.01); *H05K 1/0242* (2013.01); *H05K 1/119* (2013.01); *H05K 3/26* (2013.01); *H05K 2201/0373* (2013.01)

(58) Field of Classification Search
CPC ..... H05K 1/119; H05K 1/0242; H05K 1/0296
See application file for complete search history.

(56) References Cited

FOREIGN PATENT DOCUMENTS

| JP | 6-61612 A | 3/1994 |
|---|---|---|
| JP | 2004-218033 A | 8/2004 |

(Continued)

OTHER PUBLICATIONS

International Search Report in International Application No. PCT/KR2018/010973, filed Sep. 18, 2018.

*Primary Examiner* — Jeremy C Norris
(74) *Attorney, Agent, or Firm* — Saliwanchik, Lloyd & Eisenschenk

(57) ABSTRACT

A printed circuit board according to one embodiment of the present invention comprises an insulation board and a plurality of metal electrodes disposed on the insulation board, wherein: the plurality of metal electrodes include a first electrode and a second electrode; the first electrode includes a first surface parallel to an upper surface of the insulation board, a second surface facing the first surface, a first side surface disposed between the first surface and the second surface, and a second side surface facing the first side surface; a part of the first side surface and a part of the second side surface protrude toward the outside of the first electrode in the direction parallel to the upper surface of the insulation board; the first side surface protrudes farther in an area adjacent to the first surface than in an area adjacent to the second surface; and the second side surface protrudes farther in the area adjacent to the second surface than in the area adjacent to the first surface.

17 Claims, 8 Drawing Sheets

(51) Int. Cl.
*H05K 1/11* (2006.01)
*H05K 3/26* (2006.01)

(56) References Cited

FOREIGN PATENT DOCUMENTS

| | | |
|---|---|---|
| JP | 2005-26645 A | 1/2005 |
| JP | 2005-286143 A | 10/2005 |
| JP | 2012-195535 A | 10/2012 |

PRINTED CIRCUIT BOARD AND MANUFACTURING METHOD THEREFOR

CROSS-REFERENCE TO RELATED APPLICATIONS

This application is the U.S. national stage application of International Patent Application No. PCT/KR2018/010973, filed Sep. 18, 2018, which claims the benefit under 35 U.S.C. § 119 of Korean Application No. 10-2017-0128152, filed Sep. 29, 2017, the disclosures of each of which are incorporated herein by reference in their entirety.

TECHNICAL FIELD

The present invention relates to a printed circuit board and a manufacturing method thereof.

BACKGROUND ART

A printed circuit board is included in a light emitting device, an electronic component, an automobile, a home appliance, and the like, and has a structure composed of an insulation board and a metal board which is disposed on the insulation board and is patterned.

FIG. 1 is a cross-sectional view of a patterned printed circuit board. Referring to FIG. 1, metal boards 20 and 22 are disposed on both surfaces of an insulation board 10, and the metal board 22 disposed on an upper surface of the insulation board 10 is patterned. Generally, the metal board 20, the insulation board 10, and the metal board 22 may be patterned through a method of spraying an etchant on an upper surface of the metal board 22 after laminating the metal board 20, the insulation board 10, and the metal board 22 in order.

In this case, since an amount of the etchant which reaches down from the surface of the metal board 22 is reduced, the amount etched from the surface of the metal board 22 toward the bottom is reduced. Such an undercut phenomenon tends to become severe when the thickness of the metal board 22 is increased.

Meanwhile, a thickness of a metal board mainly applied to a printed circuit board included in a home appliance such as a refrigerator, an air conditioner or the like or an automobile may be 300 μm or more. When a metal board having a thickness of 300 μm or more is patterned in the same manner as in FIG. 1, a fine pattern is difficult to be implemented. For example, when the metal board having a thickness of 300 μm or more is etched, a width of the pattern exceeds 300 μm, and accordingly, there is a problem that it is difficult to obtain a fine pattern having an aspect ratio of 1 or more, which is a ratio of thickness to width.

DISCLOSURE

Technical Problem

The present invention is directed to providing a printed circuit board having a large aspect ratio and a manufacturing method thereof.

Technical Solution

One aspect of the present invention provides a printed circuit board including an insulation board and a plurality of metal electrodes disposed on the insulation board, wherein the plurality of metal electrodes include a first electrode and a second electrode, the first electrode includes a first surface parallel to an upper surface of the insulation board, a second surface opposite to the first surface, a first side surface disposed between the first surface and the second surface, and a second side surface opposite to the first side surface, a part of the first side surface and a part of the second side surface protrude toward the outside of the first electrode in a direction parallel to the upper surface of the insulation board, the first side surface protrudes further in an area adjacent to the first surface than in an area adjacent to the second surface, and the second side surface protrudes further in the area adjacent to the second surface than in the area adjacent to the first surface.

A protruding length of the first side surface from an area adjacent to the first surface may be 6 to 8% of a height of the first electrode, and a protruding length of the second side surface from an area adjacent to the second surface may be 3 to 5% of a height of the first electrode.

The protruding length of the first side surface from the area adjacent to the first surface may be 120 to 270% of the protruding length of the second side surface from the area adjacent to the second surface.

At least one of an angle between the first surface and the first side surface at a point at which the first surface and the first side surface meet and an angle between the first surface and the second side surface at a point at which the first surface and the second side surface meet may be 60 to 80°.

A ratio of a length of the first surface, a length of the second surface, and a length in a direction parallel to the first surface at a middle height between the first surface and the second surface may be 1:0.95 to 1.05:0.95 to 1.05.

At the middle height between the first surface and the second surface, at least one of an angle between the first surface and the first side surface, an angle between the first surface and the second side surface, an angle between the second surface and the first side surface, and an angle between the second surface and the second side surface may be 95 to 120°.

The printed circuit board may further include an insulation layer disposed between the first electrode and the second electrode.

An aspect ratio of the insulation layer may be greater than or equal to 1.

A height of the second surface may be greater than a height of an upper surface of the insulation layer.

An area at which the second surface and the second side surface meet may have a round shape having a predetermined curvature.

The area at which the second surface and the second side surface meet and the insulation layer may be connected without a step.

A thickness of the plurality of metal electrodes may be greater than or equal to 300 μm.

Another aspect of the present invention provides a method of manufacturing a printed circuit board including providing a metal board, moving the metal board in a direction parallel to the metal board, and simultaneously spraying an etchant on both surfaces of the metal board to form a plurality of metal electrodes including a first electrode and a second electrode, filling a space between the plurality of metal electrodes formed on the metal board with an insulating resin, polishing an upper surface and a lower surface of the metal board, and disposing an insulation board on at least one surface of the upper surface and the lower surface of the metal board.

Advantageous Effects

According to an embodiment of the present invention, a printed circuit board having a thickness of 300 μm or more in which a fine pattern having an aspect ratio which is greater than or equal to 1 is formed can be obtained According to an embodiment of the present invention, the structure of a patterned metal board can be stably supported, and a printed circuit board having a high withstand voltage can be obtained by controlling a tunneling problem.

A printed circuit board according to an embodiment of the present invention can be easily manufactured and can be implemented in multiple layers.

A printed circuit board according to an embodiment of the present invention has an excellent heat dissipation performance and has a high bonding strength between an insulation board and a metal board.

MODES OF THE INVENTION

Figure 1:
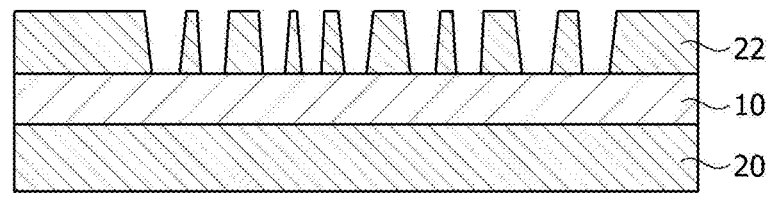
FIG. 1 is a cross-sectional view of a patterned printed circuit board.

Since the present invention may be variously changed and have various embodiments, particular embodiments will be exemplified and described in the drawings. However, the present invention is not limited to the particular embodiments and includes all changes, equivalents, and substitutes within the spirit and the scope of the present invention.

Further, it should be understood that, although the terms "second," "first," and the like may be used herein to describe various elements, the elements are not limited by the terms. The terms are only used to distinguish one element from another. For example, a first element could be termed a second element, and similarly, a second element could be termed a first element without departing from the scope of the present invention. The term "and/or" includes any one or any combination among a plurality of associated listed items.

Terms used in the present invention are used solely to describe the particular embodiments and not to limit the present invention. The singular form is intended to also include the plural form, unless the context clearly indicates otherwise. It should be further understood that the terms "include," "including," "provide," "providing," "have," and/or "having" specify the presence of stated features, integers, steps, operations, elements, components, and/or groups thereof but do not preclude the presence or addition of one or more other features, integers, steps, operations, elements, components, and/or groups thereof.

Unless otherwise defined, all terms including technical or scientific terms used in the present invention have meanings which are the same as those of terms generally understood by those skilled in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A case in which a component such as a layer, a film, an area, a plate, or the like is "on" another component, includes not only a case in which the component is "directly" on another component but also a case in which still another component is present between the component and another component. On the other hand, a case in which a component is "directly on" another component refers to a case in which still another component is not present between the component and another component.

Hereinafter, the embodiments will be described in detail with reference to the accompanying drawing drawings, the same reference numerals are applied to the same or corresponding elements, and redundant description thereof will be omitted.

Figure 2:
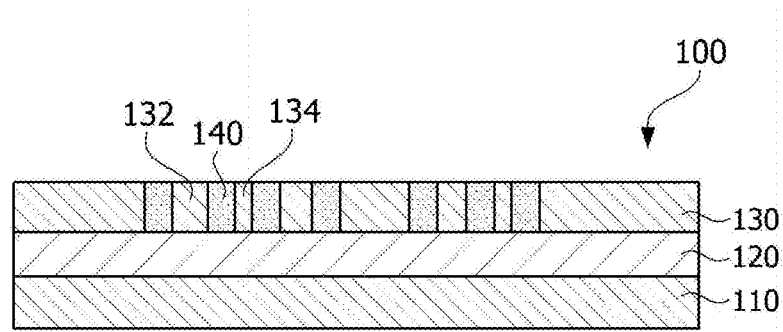
FIG. 2 is a schematic cross-sectional view of a printed circuit board according to one embodiment of the present invention.
Figure 3:
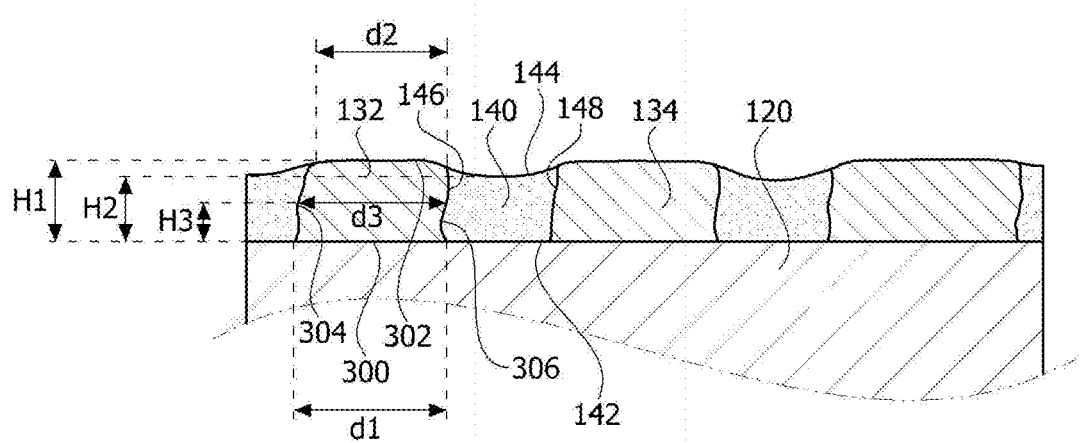
FIG. 3 is a detailed cross-sectional view of the printed circuit board according to one embodiment of the present invention.
Figure 4:
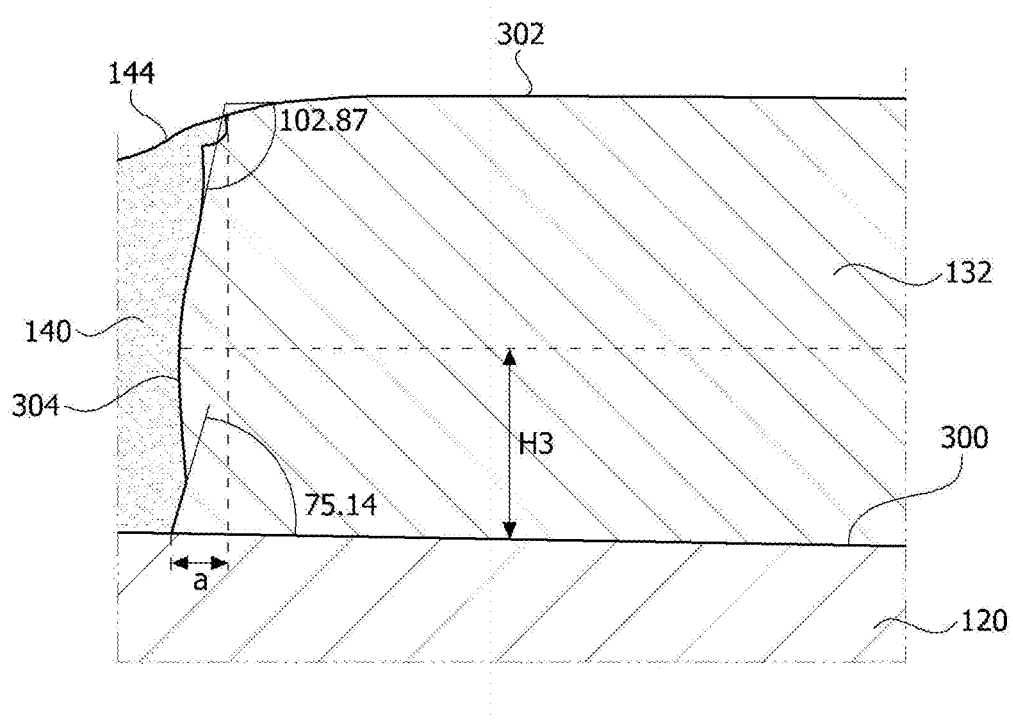
FIGS. 4 to 6 are enlarged views of a portion of the printed circuit board in FIG. 3.
Figure 5:
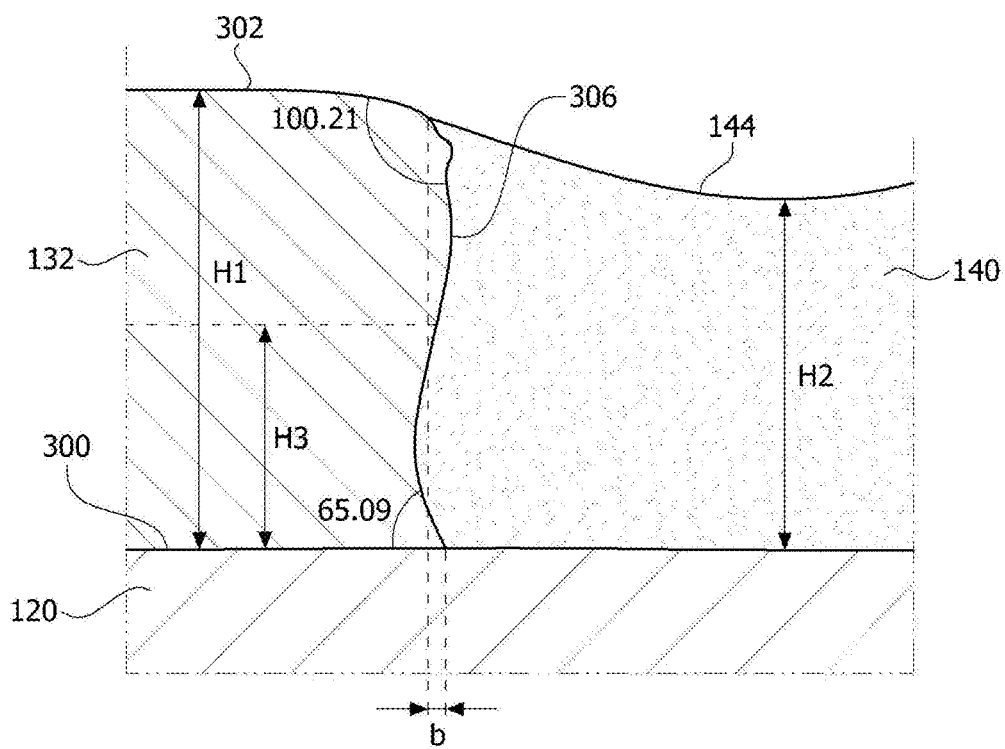
Figure 6:
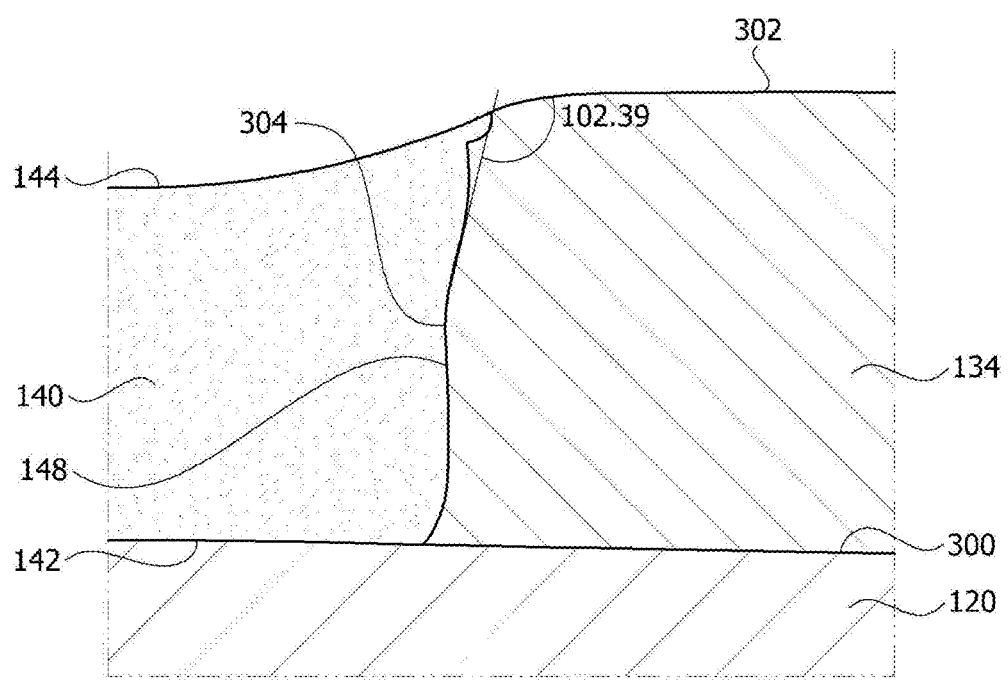

FIG. 2 is a schematic cross-sectional view of a printed circuit board according to one embodiment of the present invention, FIG. 3 is a detailed cross-sectional view of the printed circuit board according to one embodiment of the present invention, and FIGS. 4 to 6 are enlarged views of a portion of the printed circuit board in FIG. 3.

Referring to FIGS. 2 and 3, the printed circuit board 100 includes a first metal board 110, an insulation board 120 disposed on the first metal board 110, and a second metal board 130 disposed on the insulation board 120.

Each of the first metal board 110 and the second metal board 130 may have a thickness greater than or equal to 300 µm and may include copper (Cu), nickel (Ni), and the like.

The insulation board 120 may include a resin and an inorganic filling material. Here, the inorganic filling material may include at least one of alumina, aluminum nitride, and boron nitride. When the inorganic filling material includes boron nitride, it may be included in the form of boron nitride agglomerates in which plate-shaped boron nitride is aggregated.

The resin may include an epoxy compound and a hardener. In this case, a volume ratio between the epoxy compound and the hardener may be 10:1 to 10. Accordingly, the resin may be mixed with the epoxy resin.

Here, the epoxy compound may include at least one among a crystalline epoxy compound, an amorphous epoxy compound, and a silicon epoxy compound.

The crystalline epoxy compound may include a mesogen structure. Mesogen is a basic unit of a liquid crystal and includes a rigid structure.

Further, the amorphous epoxy compound may be a common amorphous epoxy compound having two or more epoxy groups in the molecule, for example, may be glycidyl etherate derived from bisphenol A or bisphenol F.

Here, the hardener may include at least one of an amine hardener, a phenol hardener, an acid anhydride hardener, a polymercaptan hardener, a polyaminoamide hardener, an isocyanate hardener, and a block isocyanate hardener, and may be used by mixing two or more sorts of hardeners.

The insulation board 120 may include a resin composite including a resin and an inorganic filling material. Alternatively, the insulation board 120 may include a particle in which the resin is coated on the inorganic filling material. For example, when the resin includes an epoxy resin, and the inorganic filling material includes a boron nitride agglomerate, the insulation board 120 may include a particle in which the epoxy resin is coated on the boron nitride agglomerate, or a particle in which the epoxy resin is further coated on the boron nitride agglomerate in which an amino group is formed on a surface thereof.

In this case, the second metal board 130 includes a plurality of metal electrodes including a first electrode 132 and a second electrode 134. In this case, the plurality of metal electrodes may form a circuit pattern. In this case, the first electrode 132 includes a first surface 300 parallel to an upper surface of the insulation board 120, a second surface 302 opposite to the first surface 300, a first side surface 304 disposed between the first surface 300 and the second surface 302, and a second side surface 306 opposite to the first side surface 304. A description of the first electrode 132 may be identically applied to the plurality of metal electrodes in addition to the second electrode 134 in the second metal board 130. Here, the second surface 302 may be mixed with an upper surface of the first electrode 132.

An insulation layer 140 is further disposed between the first electrode 132 and the second electrode 134. The insulation layer 140 may include solder resist (SR) ink or photo solder resist (PSR) ink. The insulation layer 140 may control a tunneling problem to improve a withstand voltage and stably support structures of the first electrode 132 and the second electrode 134 by insulating the first electrode 132 and the second electrode 134 from each other. Table 1 shows withstand voltage test results according to Comparative Example and Embodiment. In Embodiment, a space between the electrodes was filled with the SR ink, and in Comparative Example, the space between the electrodes was not filled with the SR ink and withstand voltage tests were performed on the basis of six samples.

TABLE 1

| Experiment number | Sample 1 | Sample 2 | Sample 3 | Sample 4 | Sample 5 | Sample 6 | Average (kV) |
|---|---|---|---|---|---|---|---|
| Comparative Example | 2.2 | 2.32 | 2.53 | 1.86 | 2.16 | 2.43 | 2.25 |
| Embodiment | 7.85 | 7.30 | 8.23 | 8.05 | 8.11 | 7.79 | 7.89 |

Referring to Table 1, it can be seen that withstand voltages according to Embodiment are significantly greater than withstand voltages according to Comparative Example. Like the first electrode 132, the insulation layer 140 may also include a first surface 142 parallel to the upper surface of the insulation board 120, a second surface 144 opposite to the first surface 142, a first side surface 146 disposed between the first surface 142 and the second surface 144, and a second side surface 148 opposite to the first side surface 146.

In this case, the second surface 144 which is an upper surface of the insulation layer 140 may have a shape concavely connected without a step from the second surface 302 which is an upper surface of the first electrode 132 to an upper surface of the second electrode 134. That is, with respect to the upper surface of the insulation board 120, a height H1 of the second surface 302 of the first electrode 132 may be greater than a height H2 of the second surface 144 of the insulation layer 140. Further, the second side surface 306 of the first electrode 132 may come into close contact with the first side surface 146 of the insulation layer 140.

More specifically, referring to FIGS. 3 to 6, a portion of each of the first side surface 304 and the second side surface 306 of the first electrode 132 protrudes toward the outside of the first electrode 132 in a direction parallel to the upper surface of the insulation board 120. In this case, a protruding area of the first side surface 304 and a protruding area of the second side surface 306 may not be symmetrical to each other, and heights thereof may be different. That is, the first side surface 304 may protrude further from an area adjacent to the first surface 300 of the first electrode 132 than from an area adjacent to the second surface 302 of the first electrode 132, and the second side surface 306 may protrude further from the area adjacent to the first surface 300 of the first electrode 132 than from the area adjacent to the first surface 300 of the first electrode 132. Accordingly, as shown in the drawings, in a cross-sectional view of the first electrode 132, each of the first side surface 304 and the second side surface 306 may be formed to be wavy.

In this case, a protruding length a of the first side surface 304 of the first electrode 132 from the area adjacent to the first surface 300 may be 6 to 8%, and preferably, 6.5 to 7.5% of the height H1 of the first electrode 132, a protruding length b of the second side surface 306 of the first electrode 132 from the area adjacent to the second surface 302 may be 3 to 5%, and preferably, 3.5 to 4.5% of the height H1 of the first electrode 132, and the protruding length a of the first side surface 304 from the area adjacent to the first surface 300 may be 120 to 270%, preferably, 120 to 200%, and more preferably, 120 to 180% of the protruding length b of the second side surface 306 from the area adjacent to the second surface 302. When the protruding length a and the protruding length b satisfy the numerical range, it is possible to realize a reliable circuit board without electrical influence on neighboring electrodes. Here, the protruding length a of the first side surface 304 of the first electrode 132 from the area adjacent to the first surface 300 may be defined as a length from a projected line to a point to which the first side surface 304 protrudes from the area adjacent to the first surface 300 after projecting the line in which the second surface 302 and the first side surface 304 of the first electrode 132 meet the upper surface of the insulation layer 140 to the upper surface of the insulation board 120. Further, the protruding length b of the second side surface 306 of the first electrode 132 from the area adjacent to the first surface 300 may be defined as a length from a projected line to a point to which the second side surface 304 protrudes from the area adjacent to the first surface 300 after projecting the line in which the second surface 302 and the second side surface 306 of the first electrode 132 meet the upper surface of the insulation layer 140 to the upper surface of the insulation board 120.

In this case, at least one among an angle between the first surface 300 and the first side surface 304 at a point at which the first surface 300 and the first side surface 304 of the first electrode 132 meet and an angle between the first surface 300 and the second side surface 306 at a point at which the first surface 300 and the second side surface 306 meet may be an acute angle, preferably, 60 to 80°.

Meanwhile, according to the embodiment of the present invention, in a direction parallel to the insulation board 120, a length d1 of the first surface 300, a length d2 of the second surface 302, and a length d3 in a direction parallel to the first surface 300 at a middle height between the first surface 300 and the second surface 302 may be almost similar. Preferably, in the direction parallel to the insulation board 120, a ratio between the length d1 of the first surface 300, the length d2 of the second surface 302, and the length d3 in the direction parallel to the first surface 300 at a middle height H3 between the first surface 300 and the second surface 302 may be 1:0.95 to 1.05:0.95 to 1.05. Accordingly, unlike FIG. 1, a problem in that a distance between the electrodes decreases when becoming closer to the insulation board 120 from an upper surface of the metal board 130 may be inhibited. Accordingly, even when the metal board 130 has a thickness of 300 µm or more, a fine pattern may be implemented.

Further, according to the embodiment of the present invention, at the middle height H3 between the first surface 300 and the second surface 302 of the first electrode 132, at least one among an angle between the first surface 300 and the first side surface 304, an angle between the first surface 300 and the second side surface 306, an angle between the second surface 302 and the first side surface 304, and an angle between the second surface 302 and the second side surface 306 may be an obtuse angle, for example, 95 to 120°. Specifically, an area at which the second surface 302 and the second side surface 306 of the first electrode 132 meet may have a round shape having a predetermined curvature. Here, the angle between the first surface 300 and the first side surface 304 at the middle height H3 between the first surface 300 and the second surface 302 of the first electrode 132 may refer to an angle formed by a tangent of the first surface 300 of the first electrode 132 and a tangent of the first side surface 304 at the middle height H3. Like the above, the angle between the first surface 300 and the second side surface 306 may refer to an angle formed by the tangent of the first surface 300 and a tangent of the second side surface 306 at the middle height H3, the angle between the second surface 302 and the first side surface 304 may refer to an angle formed by a tangent of the second surface 302 and the tangent of the first side surface 304 at the middle height H3, and the angle between the second surface 302 and the second side surface 306 may refer to an angle formed by the tangent of the second surface 302 and the tangent of the second side surface 306 at the middle height H3.

Hereinafter, a method of manufacturing the printed circuit board according to the embodiment of the present invention will be described.

Figure 7:
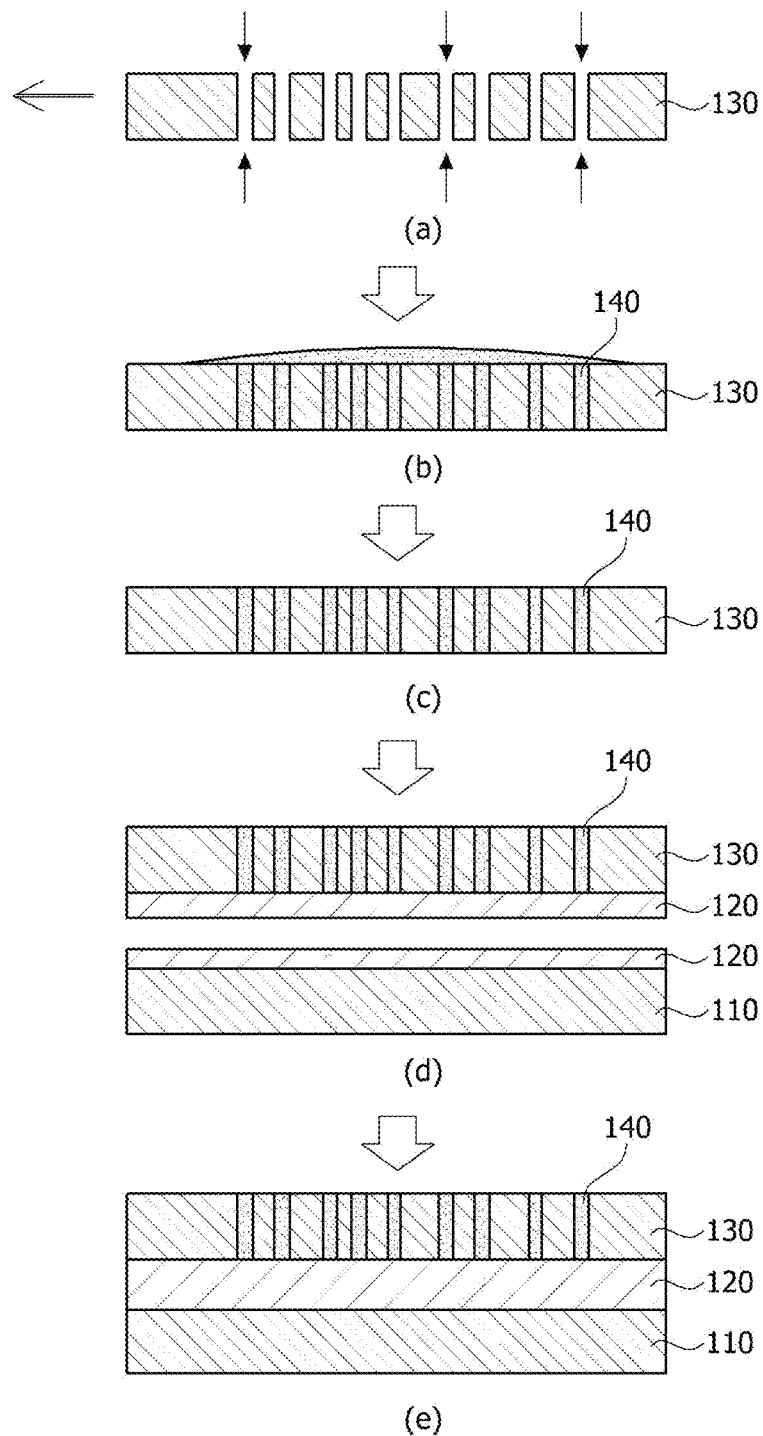
FIG. 7 illustrates a method of manufacturing the printed circuit board according to one embodiment of the present invention.

FIG. 7 illustrates the method of manufacturing the printed circuit board according to one embodiment of the present invention, and FIGS. 8a-8d illustrate a method of manufacturing a printed circuit board according to another embodiment of the present invention.

Referring to FIG. 7A, a metal board 130 is provided, the provided metal board 130 is moved in a direction parallel to the metal board 130, and a plurality of metal electrodes are formed by simultaneously spraying an etchant on both surfaces of the metal board 130. Here, the metal board 130 may include at least one of copper and nickel, and may have a thickness of 300 µm or more. As described above, when the etchant is simultaneously sprayed on both surfaces of the metal board 130, an undercut problem that a width of the pattern decreases from an upper surface to a lower surface of the metal board 130 may be inhibited. Accordingly, a metal electrode in which a length of the upper surface, a length of the lower surface, and a length in a direction parallel to the upper surface or lower surface at a middle height between the upper surface and the lower surface are almost similar may be obtained, and a fine pattern of which an aspect ratio (ratio of height to length) of a space patterned between the metal electrode and the metal electrode is greater than or equal to 1 may be implemented. In this case, the aspect ratio of the space patterned between the metal electrode and the metal electrode may be 1 to 2, preferably, 1.05 to 1.8, and more preferably, 1.1 to 1.5.

Further, when the metal board 130 is moved in the direction parallel to the metal board 130 and the etchant is simultaneously sprayed on both surfaces of the metal board 130, since oscillation occurs in front of and behind a nozzle and thus a center of the pattern is biased to one side, the pattern may be patterned to be wavy, and an area in which the lower surface and a side surface of the metal electrode protrude to form an acute angle may be formed.

Further, referring to FIG. 7B, a space between the plurality of metal electrodes formed on the metal board is filled with an insulating resin. To this end, a gel type or liquid type SR or PSR ink is coated on the metal board patterned with the plurality of metal electrodes. The SR or PSR ink has insulation performance and thus may insulate the plurality of metal electrodes when disposed between the plurality of patterned metal electrodes. Further, the SR or PSR ink is hardened by heat and thus may stably support spaces between the plurality of patterned metal electrodes.

Further, referring to FIG. 7C, the upper surface and the lower surface of the metal board are polished. Accordingly, the SR or PSR ink which remains in the upper surface and the lower surface of the metal board without being filled between the plurality of patterned metal electrodes may be removed, and an insulation layer 140 may be formed. In this case, since the SR or PSR ink has a strength weaker than that of the metal board, the SR or PSR ink may be further carved in comparison with the metal board. Accordingly, the upper surface of the insulation layer 140 may have a shape concavely connected without a step from an upper surface of one metal electrode to an upper surface of another metal electrode adjacent thereto.

Further, referring to FIG. 7D, an insulation board 120 is disposed on at least one of the upper surface and the lower surface of the metal board 130 which undergoes the process in FIG. 7C, and referring to FIGS. 7D and 7E, thermal compression and hardening are performed together with the insulation board 120 disposed on the metal board 110. Here, although not shown, the insulation board 120 disposed on the metal board 110 may also undergo the processes of FIGS. 7A to 7C.

When a printed circuit board is manufactured through the above-described process, a fine pattern may also be formed in the metal board having a thickness of 300 µm or more.

Figure 8A:
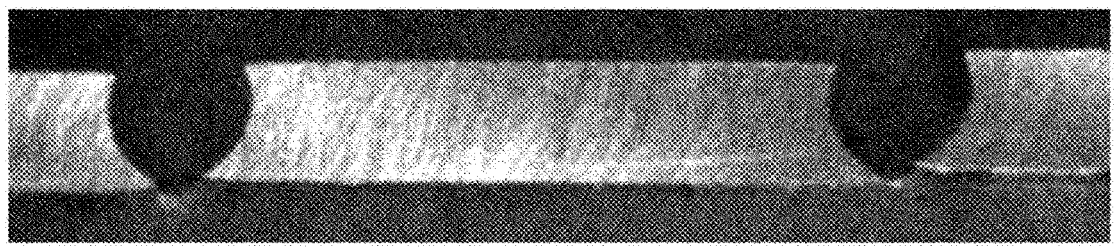
FIGS. 8a-8d are photographs of a cross section of the printed circuit board manufactured according to Comparative Example and Embodiment.
Figure 8B:
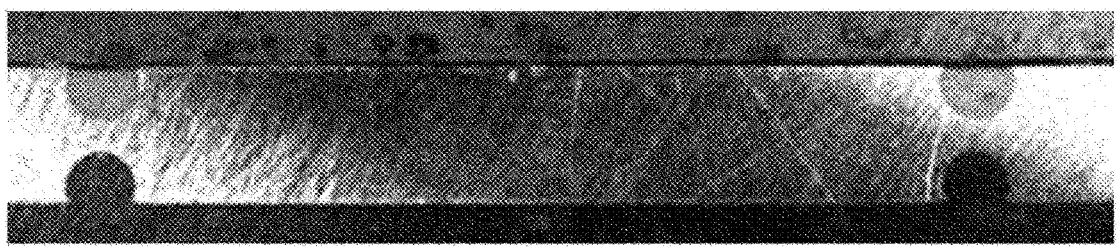
Figure 8C:
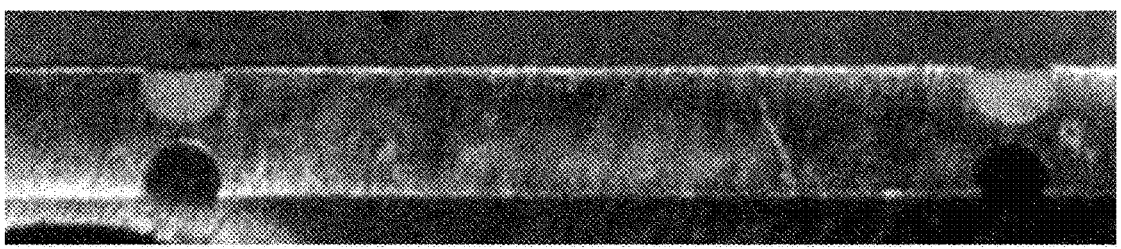
Figure 8D:
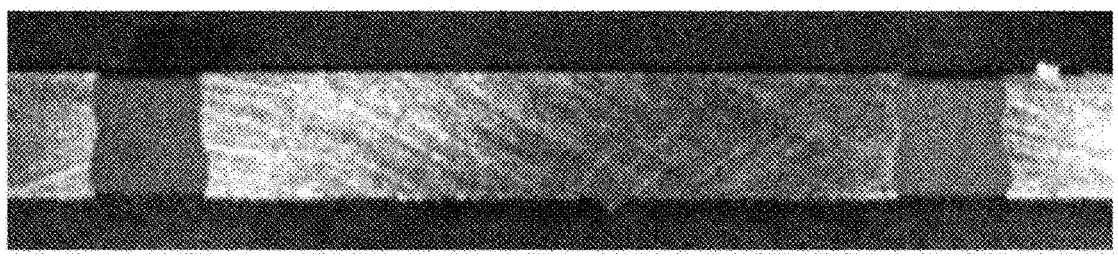

FIG. 8A is a photograph of a cross section of a pattern formed according to Comparative Example, and FIGS. 8B, 8C, and 8D are photographs illustrating a process of etching a pattern according to Embodiment. a cross section of a copper board having a thickness of 900 µm was wet-etched in Comparative Example, and both surfaces of the copper board having a thickness of 900 µm are wet-etched in Embodiment.

Referring to FIG. 8A, according to Comparative Example, since a width of the pattern was formed to be roughly 978 µm, an aspect ratio which is smaller than 1 (roughly 0.92) was obtained, but referring to FIGS. 8B, 8C, and 8D, according to Embodiment, since a width of the pattern was formed to be roughly 633 µm, an aspect ratio which is greater than or equal to 1 (roughly 1.42) was obtained.

Meanwhile, the method of manufacturing the printed circuit board according to the embodiment of the present invention may also be applied to a multilayer printed circuit board.

Figure 9:
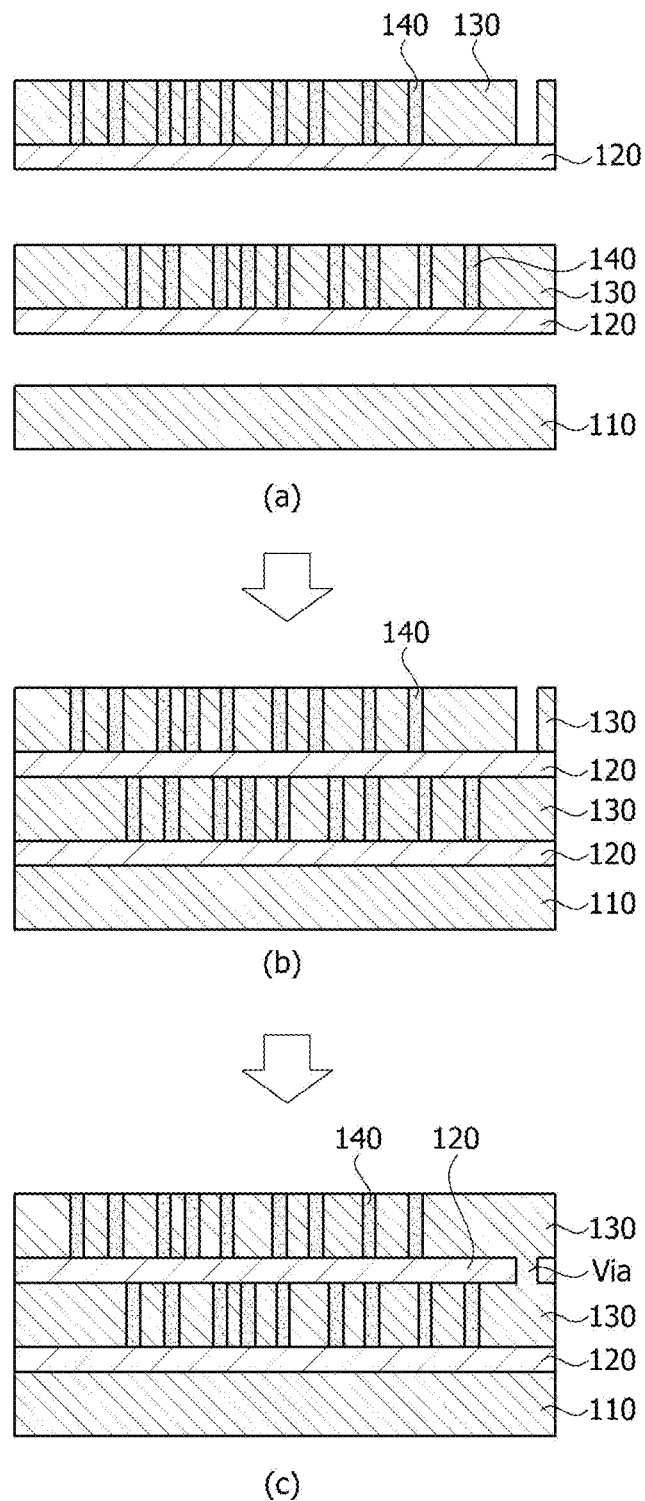
FIG. 9 illustrates a method of manufacturing a printed circuit board according to another embodiment of the present invention.

Referring to FIG. 9A, a structure including a plurality of insulation boards 120 and a plurality of metal boards 130 is provided through the processes of FIGS. 7A to 7D. Referring to FIG. 9B, after the structure including the plurality of insulation boards 120 and the plurality of metal boards 130 is stacked on a metal board 110, as shown in FIG. 9C, a via hole is formed in the insulation board 120. Accordingly, the printed circuit board according to the embodiment of the present invention may be obtained as a multilayer structure.

Figure 10:
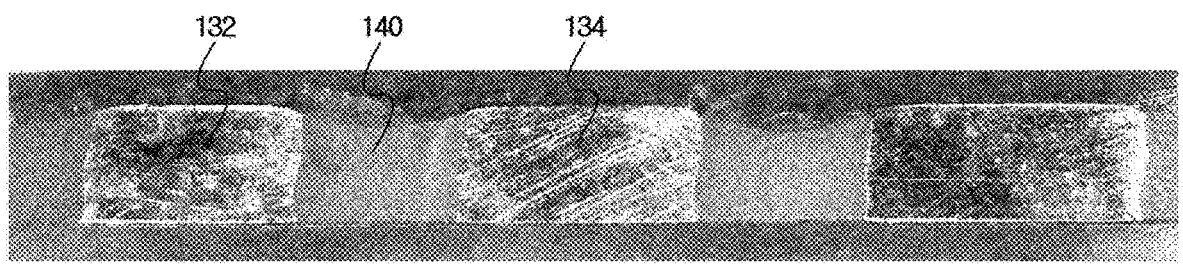
FIG. 10 is a photograph of a cross section of the printed circuit board manufactured by the method according to the embodiment of the present invention.
Figure 11:
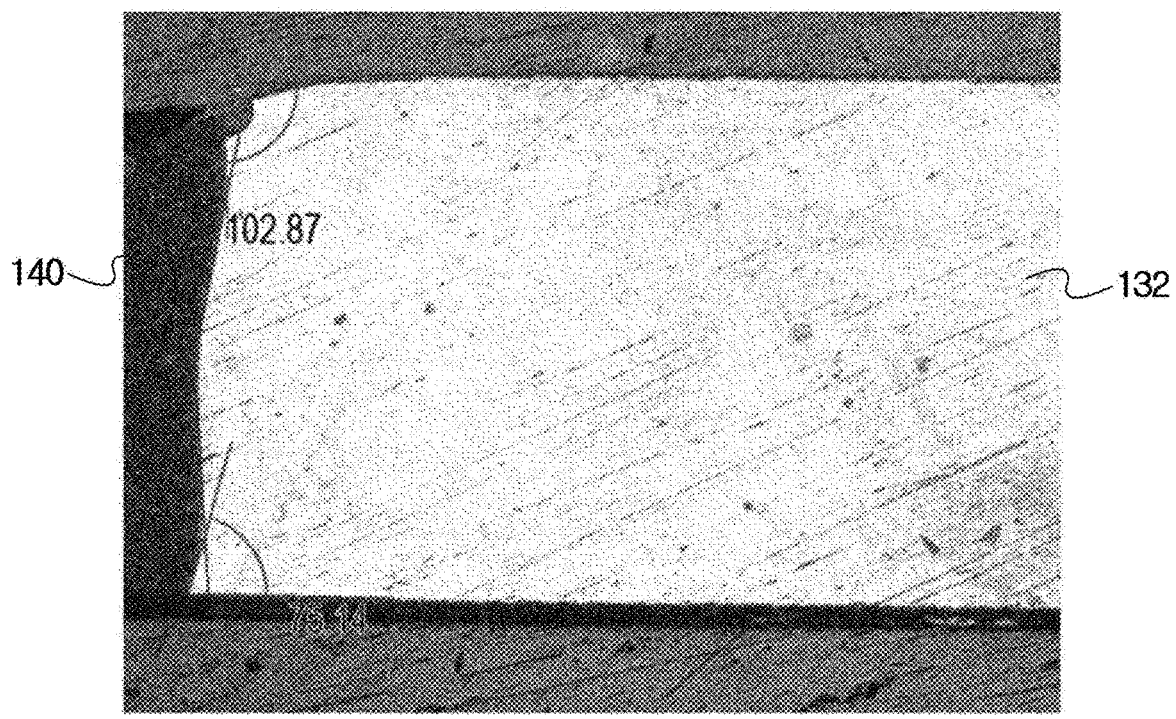
FIGS. 11 to 13 are enlarged views of a portion of the photograph of the cross section in FIG. 10.
Figure 12:
Figure 13:
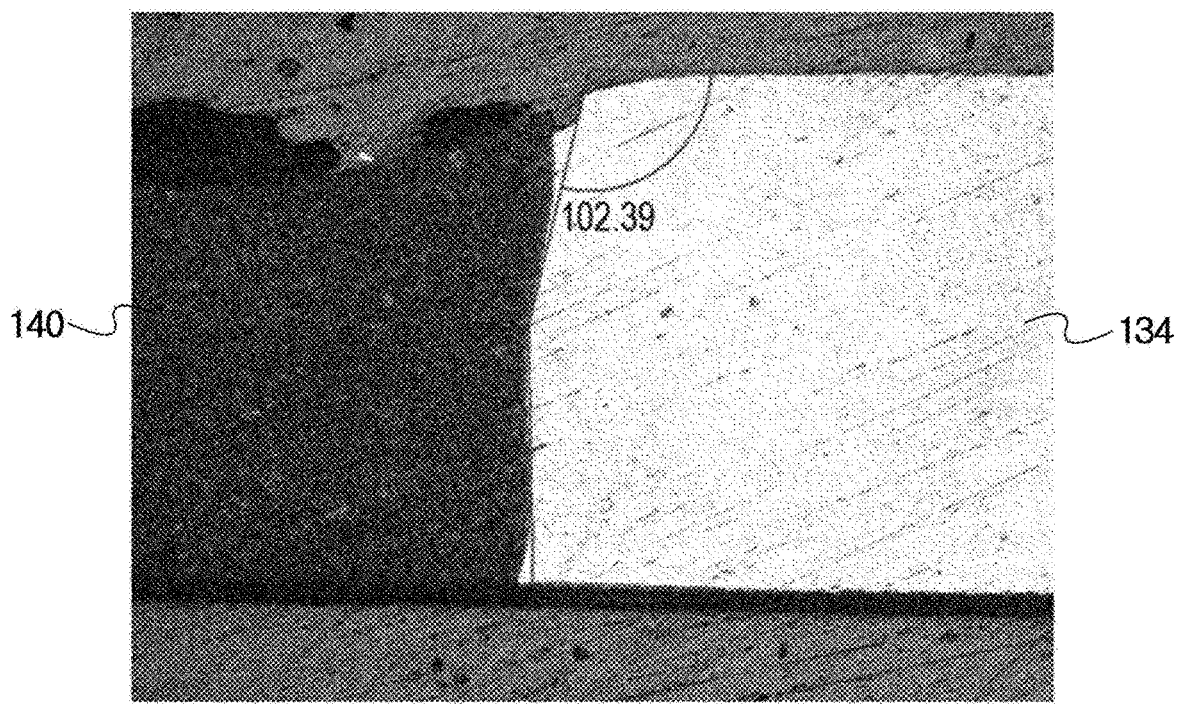

FIG. 10 is a photograph of a cross section of the printed circuit board manufactured by the method according to the embodiment of the present invention, and FIGS. 11 to 13 are enlarged views of a portion of the photograph of the cross section in FIG. 10.

Referring to FIGS. 10 to 13, the printed circuit board manufactured by the method according to one embodiment of the present invention may be patterned with a plurality of metal electrodes 132 and 134, and a space between the plurality of metal electrodes may be filled with an insulation layer 140. Further, a metal electrode in which a length of an upper surface, a length of a lower surface, and a length in a direction parallel to the upper surface or lower surface at a middle height between the upper surface and the lower surface are almost similar may be obtained. In addition, a side surface of each of the metal electrodes protrudes toward the outside, an angle between the side surface and a bottom surface of the metal electrode at a point at which the side surface and the bottom surface of the metal electrode meet forms an acute angle, and an angle between the side surface and the bottom surface or the side surface and an upper surface may form an obtuse angle at a middle height of the side surface of the metal electrode.

As described above, according to the embodiment of the present invention, a printed circuit board, in which a fine pattern having an aspect ratio greater than or equal to 1 is formed in a metal board having a thickness of 300 μm or more, may be obtained.

Although preferable embodiments of the present invention are described above, those skilled in the art may variously modify and change the present invention within the scope of the spirit and area of the present invention disclosed in the claims which will be described later.

REFERENCE NUMERALS

110: first metal board
120: insulation board
130: second metal board
132: first electrode
134: second electrode
140: insulation layer

The invention claimed is:

1. A printed circuit board comprising:
an insulation board; and
a plurality of metal electrodes disposed on the insulation board,
wherein the plurality of metal electrodes include a first electrode and a second electrode,
the first electrode includes a first surface parallel to an upper surface of the insulation board, a second surface opposite to the first surface, a first side surface disposed between the first surface and the second surface, and a second side surface opposite to the first side surface,
a part of the first side surface and a part of the second side surface protrude toward the outside of the first electrode in a direction parallel to the upper surface of the insulation board,
the first side surface protrudes further in an area adjacent to the first surface than in an area adjacent to the second surface, and
the second side surface protrudes further in the area adjacent to the second surface than in the area adjacent to the first surface.

2. The printed circuit board of claim 1, wherein:
a protruding length of the first side surface from an area adjacent to the first surface is 6% to 8% of a height of the first electrode; and
a protruding length of the second side surface from an area adjacent to the second surface is 3% to 5% of a height of the first electrode.

3. The printed circuit board of claim 2, wherein the protruding length of the first side surface from the area adjacent to the first surface is 120% to 270% of the protruding length of the second side surface from the area adjacent to the second surface.

4. The printed circuit board of claim 1, wherein at least one of an angle between the first surface and the first side surface at a point at which the first surface and the first side surface meet and an angle between the first surface and the second side surface at a point at which the first surface and the second side surface meet is 60° to 80°.

5. The printed circuit board of claim 1, wherein a ratio of a length of the first surface, a length of the second surface, and a length in a direction parallel to the first surface at a middle height between the first surface and the second surface is 1:0.95 to 1.05:0.95 to 1.05.

6. The printed circuit board of claim 5, wherein, at the middle height between the first surface and the second surface, at least one of an angle between the first surface and the first side surface, an angle between the first surface and the second side surface, an angle between the second surface and the first side surface, and an angle between the second surface and the second side surface is 95° to 120°.

7. The printed circuit board of claim 1, comprising an insulation layer disposed between the first electrode and the second electrode.

8. The printed circuit board of claim 7, wherein an aspect ratio of the insulation layer is greater than or equal to 1.

9. The printed circuit board of claim 8, wherein an aspect ratio of the insulation layer is 1.05 to 1.8.

10. The printed circuit board of claim 7, wherein a height of the second surface is greater than a height of an upper surface of the insulation layer.

11. The printed circuit board of claim 10, wherein an area at which the second surface and the second side surface meet has a round shape having a predetermined curvature.

12. The printed circuit board of claim 11, wherein the area at which the second surface and the second side surface meet and the insulation layer are connected without a step.

13. The printed circuit board of claim 12, wherein the upper surface of the insulation layer is concavely connected from an upper surface of the first electrode to an upper surface of the second surface without a step.

14. The printed circuit board of claim 1, wherein a thickness of the plurality of metal electrodes is greater than or equal to 300 μm.

15. The printed circuit board of claim 7, wherein the insulation layer comprises a solder resist ink or a photo solder resist ink.

16. The printed circuit board of claim 1, wherein a protruding area of the first side surface and a protruding area of the second side surface are not symmetrical to each other.

17. The printed circuit board of claim 1, comprising a metal board disposed on an opposite surface of a surface on which the plurality of metal electrode are disposed among both surfaces of the insulation board.

* * * * *